(12) United States Patent
Ho

(10) Patent No.: US 8,172,063 B2
(45) Date of Patent: May 8, 2012

(54) SUBSTRATE TRANSPORTING APPARATUS AND SUBSTRATE GUIDE UNIT FOR USE THEREIN

(75) Inventor: Soon-Gyu Ho, Chungchengnam-do (KR)

(73) Assignee: Semes Co., Ltd., Chungcheongnam-do (KR)

( * ) Notice: Subject to any disclaimer, the term of this patent is extended or adjusted under 35 U.S.C. 154(b) by 1031 days.

(21) Appl. No.: 12/077,526

(22) Filed: Mar. 19, 2008

(65) Prior Publication Data

US 2008/0286084 A1 Nov. 20, 2008

(30) Foreign Application Priority Data

May 14, 2007 (KR) ........................ 10-2007-0046602

(51) Int. Cl.
*B65G 13/00* (2006.01)

(52) U.S. Cl. ....... 193/35 R; 193/37; 193/35 C; 198/785; 198/780

(58) Field of Classification Search ................ 193/35 R, 193/35 C, 37, 35 A, 35 B, 35 J; 198/780, 198/781.01–781.11, 785, 784, 791, 633, 198/636, 624, 786; 384/519, 538
See application file for complete search history.

(56) References Cited

U.S. PATENT DOCUMENTS

| | | | | |
|---|---|---|---|---|
| 1,038,514 A | * | 9/1912 | Anderson | 193/35 C |
| 1,214,825 A | * | 2/1917 | Richardson | 384/528 |
| 2,094,950 A | * | 10/1937 | Erich-Gunther Kohler | 193/37 |
| 3,826,351 A | * | 7/1974 | Fromme | 198/787 |
| 3,840,102 A | * | 10/1974 | Dawson | 193/35 R |
| 4,167,997 A | * | 9/1979 | Revells | 198/789 |
| 4,304,502 A | * | 12/1981 | Stratienko | 403/370 |
| 4,448,296 A | * | 5/1984 | Tabler | 193/35 C |
| 4,798,149 A | * | 1/1989 | Hoffmann | 105/155 |
| 5,269,607 A | * | 12/1993 | Lawson | 384/538 |
| 5,332,245 A | * | 7/1994 | King | 280/279 |
| 5,709,483 A | * | 1/1998 | Martinie | 384/538 |
| 5,876,127 A | * | 3/1999 | Casey | 384/538 |
| 5,957,261 A | * | 9/1999 | Inoue et al. | 193/37 |
| 6,425,690 B1 | * | 7/2002 | DeWachter | 384/583 |
| 6,591,962 B2 | * | 7/2003 | Miyake | 198/347.1 |
| 7,344,313 B2 | * | 3/2008 | Hansen et al. | 384/538 |
| 7,604,415 B2 | * | 10/2009 | Casey et al. | 384/538 |

FOREIGN PATENT DOCUMENTS

| | | |
|---|---|---|
| JP | 59082207 A | 5/1984 |
| JP | 1993-60630 | 8/1993 |
| JP | 08-244930 | 9/1996 |
| JP | 08-244946 A | 9/1996 |

(Continued)

*Primary Examiner* — Gene Crawford
*Assistant Examiner* — William R Harp
(74) *Attorney, Agent, or Firm* — Jenkins, Wilson, Taylor & Hunt, P.A.

(57) ABSTRACT

An apparatus for transporting substrates and a guide unit are disclosed herein. A guide unit can prevent a substrate from shaking in a side direction when the substrate is transported by the rotation of a transporting roller. The guide unit includes an inner ring and an outer ring. The outer ring includes a ring-shaped guide protruding from an outer circumferential surface of the outer ring in a side direction. The outer circumferential surface of the outer ring comes in contact with the bottom edge of a substrate to support the substrate, and a side surface of the guide comes in contact with the side of the substrate to prevent the substrate from traveling in a side direction. The inner ring rotates with the shaft, and the outer ring rotates by a friction force with the substrate.

28 Claims, 15 Drawing Sheets

FOREIGN PATENT DOCUMENTS

| | | |
|---|---|---|
| JP | 10-001207 | 6/1998 |
| JP | 3079192 | 8/2001 |
| JP | 2004131233 A | 4/2004 |
| JP | 2006214461 A | 8/2006 |
| KR | 1020050050687 A | 6/2005 |

* cited by examiner

SUBSTRATE TRANSPORTING APPARATUS AND SUBSTRATE GUIDE UNIT FOR USE THEREIN

CROSS-REFERENCE TO RELATED APPLICATIONS

This U.S. non-provisional patent application claims priority under 35 U.S.C §119 of Korean Patent Application 2007-46602 filed on May 14, 2007, the entirety of which is hereby incorporated by reference.

BACKGROUND

The present invention relates to apparatuses for use in substrate manufacturing and, more specifically, to a substrate transporting apparatus and a guide unit for use therein.

Lately, data processing apparatuses are rapidly being advanced with multiple functions and higher data processing speed. Each of these data processing apparatuses includes a display provided to display operated information. While cathode ray tubes (CRTs) are conventionally used as displays, the use of flat panel displays are significantly increasing with the recent rapid advance in semiconductor technologies. Flat panel displays are advantageous in lightness and small occupied area. Although there are many kinds of flat panel displays, liquid crystal displays (LCDs) have widely been used because they are advantageous in low power dissipation, small volume, and low driving voltage.

A variety of processes are performed to manufacture these flat panel displays. A substrate for use in a flat panel display is transported through a transporting apparatus to a chamber in which the respective processes are performed. Inside the process chamber, the substrate is. transported during a process. FIG. 1 illustrates a typical transporting apparatus 900, and FIG. 2 is an enlarged perspective view of a substrate and side rollers shown in FIG. 1. Referring to FIGS. 1 and 2, the transporting apparatus 900 includes rotatable shafts 920 disposed to be parallel with each other and transporting rollers 940 provided at the shaft 920 to rotate with the shaft 920. A side roller 960 is installed between the shafts 920 supporting a side surface of a substrate S to guide the linear transportation of the substrate S. The rotation force of the shafts 920 and the transporting rollers 940 allows the substrates S to move linearly, and the linear movement of the substrate S allows the side rollers 960 to rotate.

However, unless the position of the side roller 960 is provided precisely, the side of the substrate S is liable to collide against the side roller 960 to damage the substrate S. Moreover, if the traveling substrate S is shaken up and down, a friction is liable to be generated between the substrate S and the side roller 960 in a length direction of the side roller 960 to damage the substrate S.

SUMMARY OF THE INVENTION

Exemplary embodiments of the present invention are directed to a substrate transporting apparatus. In an exemplary embodiment, the substrate transporting apparatus may include: a plurality of rotatable shafts arranged in a row; transporting rollers fixedly coupled with the shaft to rotate with the shaft; and a guide unit configured to guide the linear movement of a substrate transported by the transporting rollers, the guide unit including an outer circumferential surface contacting the bottom edge of the substrate and an outer ring having a guide protruding outwardly from the outer circumferential surface to contact the side of the substrate.

In another exemplary embodiment, the substrate transporting apparatus may include: a plurality of rotatable shafts arranged in a row; a plurality of transporting rollers fixedly coupled with the shaft to rotate with the shaft; and a guide unit configured to guide the linear movement of a substrate transported by the transporting rollers and coupled with the shaft.

Exemplary embodiments of the present invention are directed to a guide unit provided at a substrate transporting apparatus to guide the linear movement of a substrate. In an exemplary embodiment, the guide unit may include: an outer ring having the center where a through-hole is formed and including a guide extending outwardly from an outer circumferential surface thereof; an inner ring inserted into the through-hole of the outer ring, the inner ring having the center where a through-hole is formed; and a plurality of bearings provided between the outer ring and the inner ring.

DETAILED DESCRIPTION OF PREFERRED EMBODIMENTS

Figure 1:
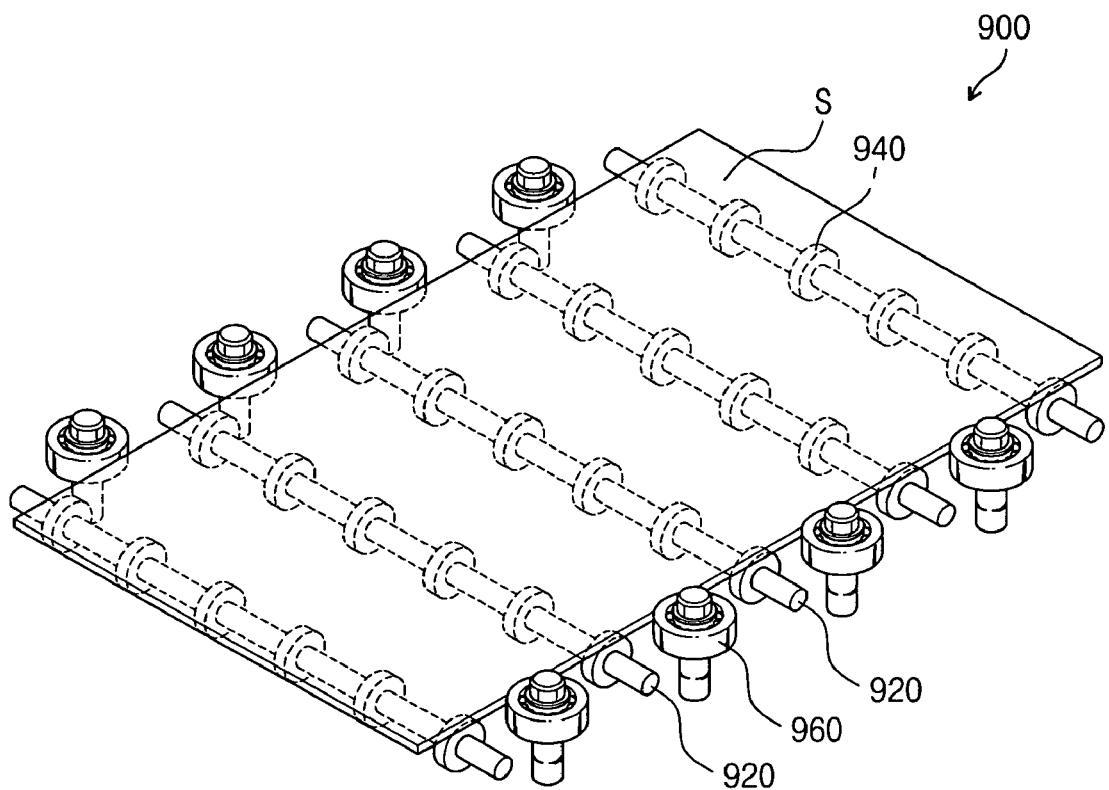
FIG. 1 is a perspective view of a typical substrate transporting apparatus.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity.

While the embodiments of the present invention will specify a rectangular glass substrate used to manufacture a liquid crystal display panel, the present invention is not limited thereto and may be applied to any apparatus for transporting a rectangular workpiece.

Figure 3:
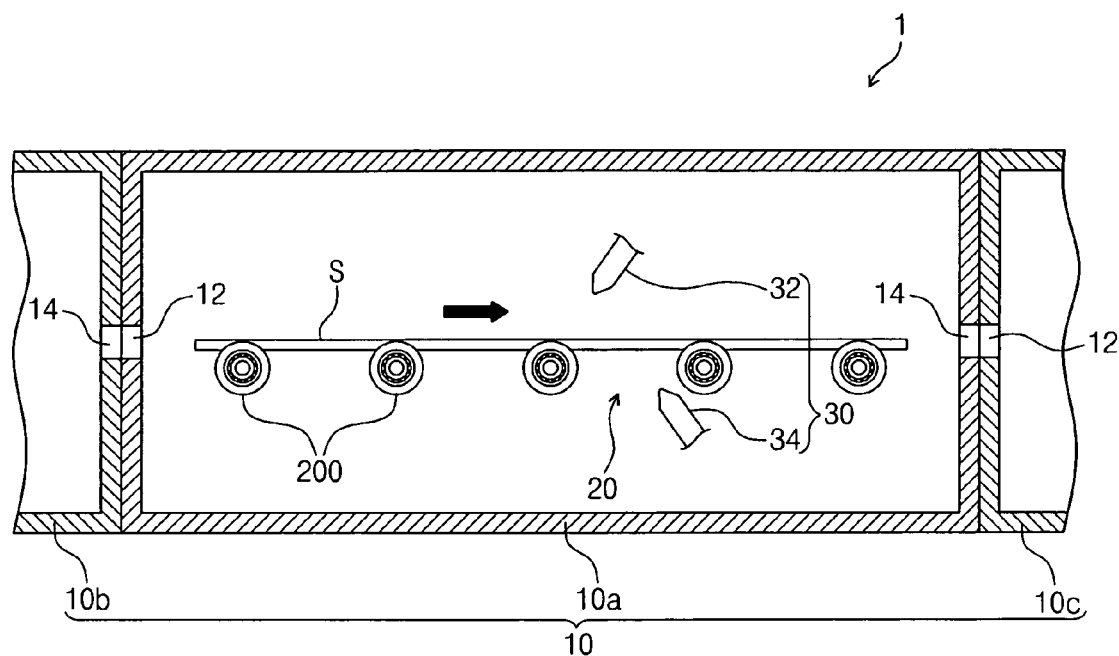
FIG. 3 illustrates an example of a substrate treating facility with a substrate treating apparatus according to the present invention.

FIG. 3 illustrates a substrate treating facility 1 with a substrate transporting apparatus 20 according to the present invention. Referring to FIG. 3, the substrate treating facility 1 includes a plurality of chambers 10, the substrate transporting apparatus 20, and a chemical injection member 30. Each of the chambers 10 defines a space where a process of a substrate S is performed. The substrate transporting apparatus 20 linearly moves the substrate S between the chambers 10 and inside each of the chamber 10. The chemical injection member 30 is installed inside the chamber 10 and supplies chemicals, such as a cleaning solution or an etching solution, according to the kind of processes performed for the substrate S. These components will now be described below in detail.

Each of the chambers 10 may have the shape of substantially hollow rectangular parallelepiped. An inlet 12 is formed at one side of the respective chamber 10, and an outlet 14 is formed at the other side thereof. A substrate S is put into the chamber 10 through the inlet 12 and taken out of the chamber 10 through the outlet 14. A substrate S travels from a foremost chamber among the chambers 10 to a hindmost chamber among the chambers 10. The substrate S is subjected to predetermined processes in the respective chambers 10. For example, a cleaning process may be performed in one chamber 10a among the chambers 10; a cleaning process may be performed in a chamber 10b disposed in front of the chamber 10a in which the cleaning process is performed; and a drying process may be performed in a chamber 10c disposed in the back of the chamber 10a in which the cleaning process is performed. In the case of the chamber 10a in which the cleaning process is performed, the chemical injection member 30 may include a top injection member 32 configured to inject a cleaning solution to a top surface of the substrate S and a bottom injection member 34 configured to inject the cleaning solution to a bottom surface thereof.

Figure 4:
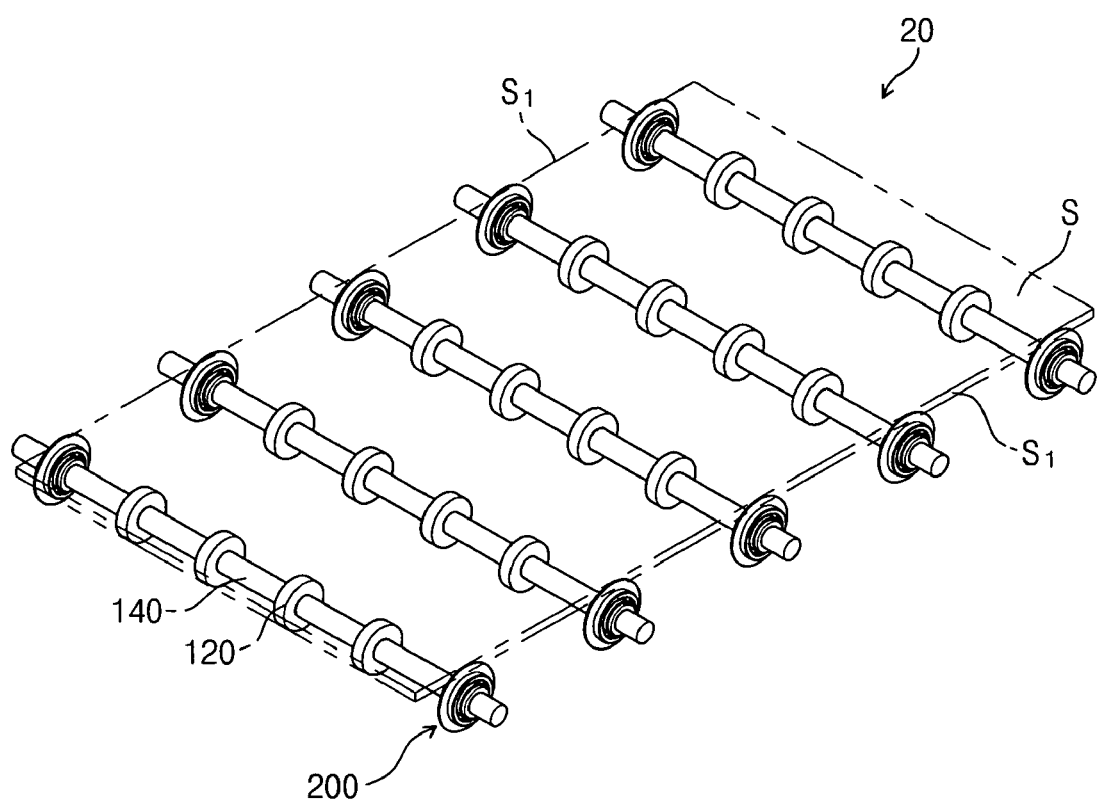
FIG. 4 is a perspective view of a substrate transporting apparatus according to an exemplary embodiment of the present invention.

The substrate transporting apparatus 20 is disposed inside the respective chambers 10. FIG. 4 is a perspective view of the substrate transporting apparatus 20 shown in FIG. 3. Referring to FIGS. 3 and 4, the substrate transporting apparatus 20 includes a plurality of transporting rollers 120, a plurality of shafts 140, and a guide unit 200. The shafts 140 are linearly arranged inside each chamber 10 and provided from a position adjacent to an inlet 12 to a position adjacent to an outlet 14. The plurality of transporting rollers 120 are fixedly coupled with the respective shafts 140 in the length direction of the shafts 140. The shafts 140 rotate on their central axes by means of a driving member (not shown), and the transporting roller 120 rotates with the shaft 140.

The driving member may be an assembly including pulleys, belts, and a motor. The assembly including pulleys, belts, and a motor will be well known in the art and will not be described in further detail. The shafts 140 and the transporting rollers 120 rotate by means of the driving member, and the substrate S travels linearly along the shafts 140 while the bottom surface of the substrate S is in contact with the transporting roller 120. Each of the shafts 140 is horizontally disposed to horizontally transport the substrate S.

The guide unit 200 is disposed at both ends of the shaft 140 to guide the linear traveling of the substrate S. The guide unit 200 supports sides $S_1$ of the substrate S in a side direction to prevent the substrate S from shaking left and right in the traveling direction of the substrate S. Among four sides of the substrate S, the above sides $S_1$ are parallel with the traveling direction of the substrate S.

Figure 5:
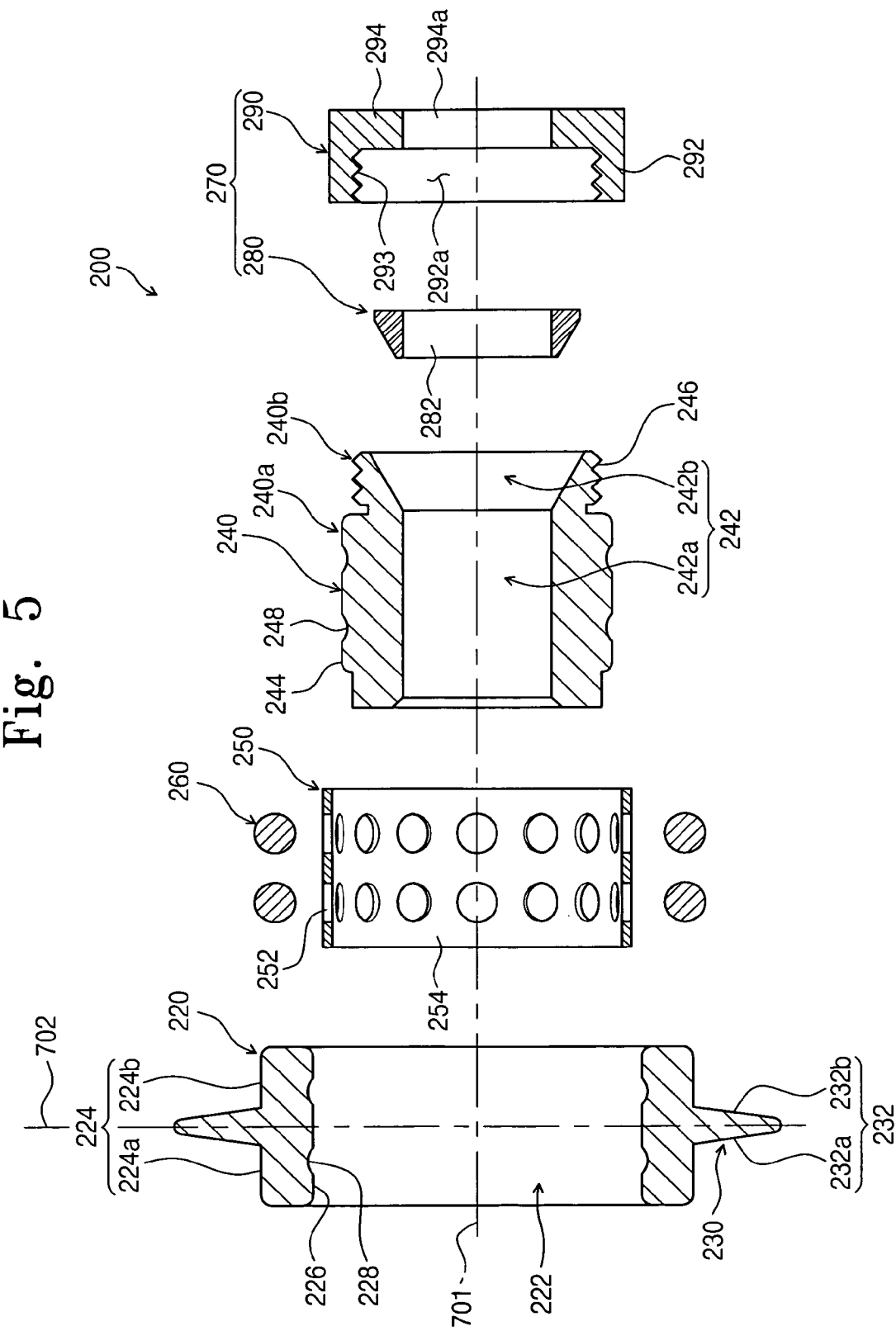
FIG. 5 is a cross-sectional view of a dissembled guide unit shown in FIG. 4.
Figure 6:
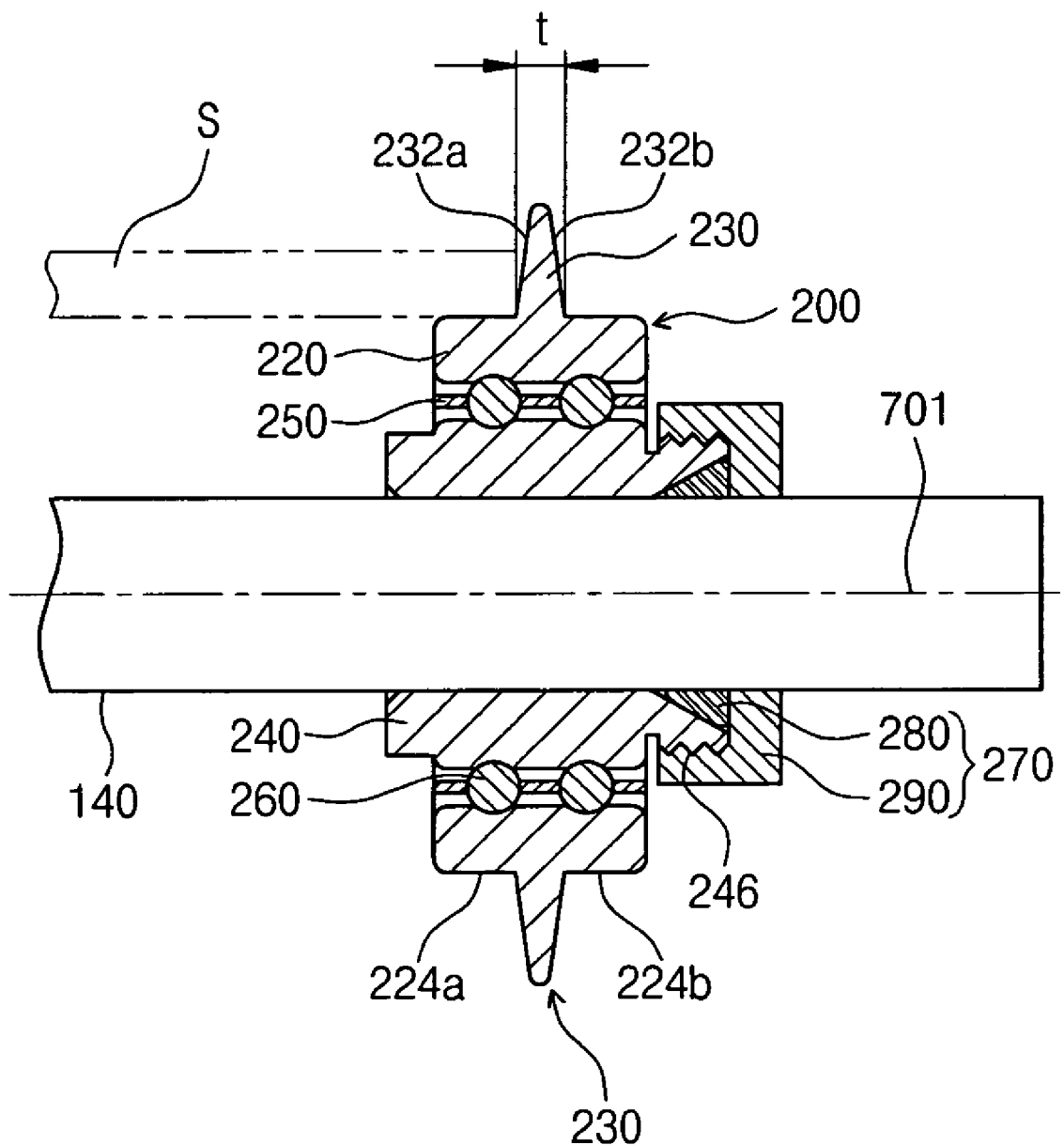
FIG. 6 is a cross-sectional view of an assembled guide unit shown in FIG. 4.
Figure 7:
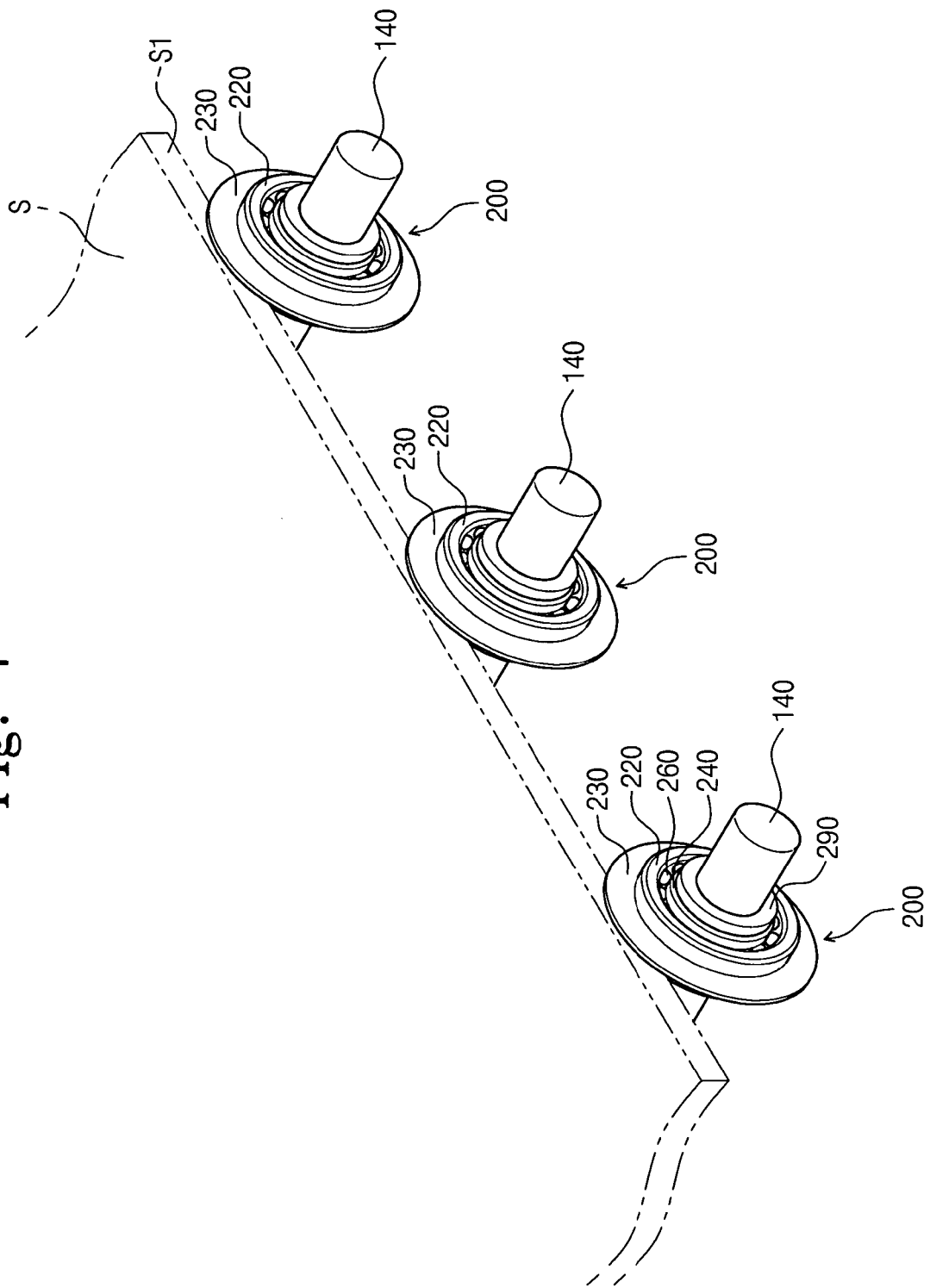
FIG. 7 is a perspective view of the guide unit, shown in FIG. 4, fixedly coupled with shafts.

FIG. 5 is an exploded cross-sectional view of the guide unit 200, and FIG. 6 is an assembled cross-sectional view thereof. FIG. 7 is a perspective view of the assembled guide unit 200 fixedly coupled with shafts.

Referring to FIGS. 5 through 7, the guide unit 200 includes an outer ring 220, an inner ring 240, a retainer 250, bearings 260, and a fixing member 270.

The outer ring 220 may have the shape of substantially a cylinder with a first through-hole 222 formed at the center thereof. The outer ring 220 is disposed to let its central axis be collinear with a central axis of the shaft 140. Since the outer ring 220 has the same diameter as a transporting roller 120, a substrate S comes in contact with an outer circumferential surface of the transporting roller 120 and an outer circumferential surface of the outer ring 220.

The guide 230 extends toward the outside of the outer ring 220 from the central region of the outer circumferential surface 224 of the outer ring 220 in a radius direction of the outer ring 220. The guide 230 may have the shape of substantially a circular ring. The thickness of the guide 230 becomes smaller as being far away from the center of the outer ring 220. The guide 230 is connected to the side of the substrate S to prevent the substrate S to travel in a side direction.

The guide 230 has an inclined surface 232, which is inclined at an obtuse angle to the outer circumferential surface 224 of the outer ring 220. The guide 230 is symmetrical relative to an axis 702 that is perpendicular to a central axis 701 of the outer ring 220. When a substrate S shakes in up and down direction or left and right direction, the inclined surface 232 guides the shaking substrate S to be loaded on the outer circumferential surface 224 of the outer ring 220. Alternatively, the guide 230 may have a surface that is perpendicular to the outer circumferential surface 224 of the outer ring 220.

Figure 12:
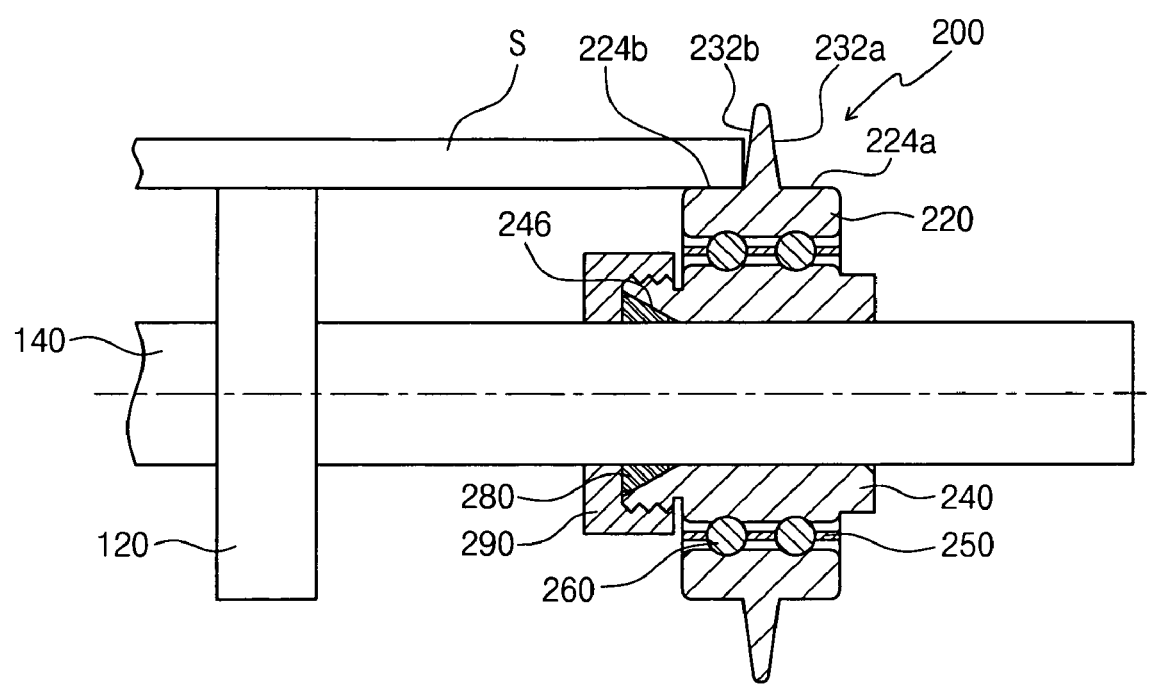
FIG. 12 illustrates the state where a guide unit of present invention is coupled with a shaft in a different direction to shown in FIG. 4.

The outer circumferential surface 224 of the outer ring 220 is divided into two regions, i.e., a first circumferential surface 224a and a second circumferential surface 224b, on the basis of the guide 230. The inclined surface 232 of the guide 230 includes a first inclined surface 232a and a second inclined surface 232b. The first inclined surface 232a is positioned adjacent to the first outer circumferential surface 224a, and the second inclined surface 232b is positioned adjacent to the second outer circumferential surface 224b. First, the guide unit 200 is provided to make the first outer circumferential surface 224a look toward the substrate S. Thus, the first outer circumferential surface 224a comes in contact with the bottom surface of the substrate S, and the first inclined surface 232a comes in contact with the side $S_1$ of the substrate S. If the first outer circumferential surface 224a and the first inclined surface 232a are deteriorated by abrasion or the like, the install direction of the guide unit 200 may be varied to make the second circumferential surface 224a look toward a substrate S. In this case, the second outer circumferential 224b comes in contact with a bottom surface of the substrate S to support the substrate S, and the second inclined surface 232b comes in contact with the side $S_1$ of the substrate S. FIG. 12 illustrates the guide unit 200 installed to be opposite to that shown in FIG. 6.

As illustrated, the guide 230 protrudes toward the center of the outer circumferential surface 224 of the outer ring 220 from the outside of the outer ring 220. However, in this embodiment, a central region includes not only the center of the outer circumferential surface 224 of the outer ring 220 but also a region except both ends of the outer circumferential surface 224 of the outer ring 220 to provide the first circumferential surface 224a and the second outer circumferential surface 224b.

The inner ring 240 is inserted into the first through-hole 222 of the outer ring 220. The inner ring 240 may have the shape of substantially a cylinder with a second through-hole 242 formed at the center thereof. In the second through-hole 242, the shaft 140 is inserted. The inner ring 240 is fixedly coupled with the shaft 140 to rotate with the shaft 140 due to a rotation force of the shaft 140. For example, the shaft 140 may be forcibly inserted into the inner ring 240.

The inner ring 240 includes a main body 240a and a sub-body 240b. A portion of the second through-hole 242a formed at the center of the main body 240a is provided to have a similar diameter to that of the shaft 140 and have a regular diameter in a length direction of the shaft 140. A portion of the second through-hole 242b formed at the sub-body 240b extends from the a portion of the second through-hole 242a formed at the center of the main body 240a and is provided to increase its diameter as being far away from the inner ring 240. That is, the second through-hole 242a provided at the main body 240a has a substantially cylindrical shape and the second through-hole 242b provided at the sub-body 240b has a substantially conic shape. Screw threads 246 are formed at the outer circumferential surface of the sub-body 240b.

A plurality of bearings 260 and a retainer 250 are inserted between the outer ring 220 and the inner ring 240. The retainer 250 may have the shape of substantially a circular ring. Circular through-holes 252 are formed along the side of the retainer ring 250. The bearings 260 are inserted into the through-holes 252 to be rotatably disposed within the through-hole 252. The bearings 260 protrude partially inwardly and outwardly from the retainer 250. Grooves 228 and 248 are formed at the outer circumferential surface 244 of the inner ring 240 and the inner circumferential surface 226 of the outer ring 220 to correspond to each other, respectively. Partial regions of the bearing 260 protruding from the retainer 250 are inserted into the grooves 228 and 248. The bearings 260 are annularly arranged along the circumference of the retainer 250 to be spaced apart from each other at regular intervals. A plurality of annular arrangements are provided. In this embodiment, two columns of bearings 260 are illustrated. Thus, loads applied to the bearings 260 are distributed to extend the lifetime of the bearings 260.

Due to the bearings 260, the outer ring 220 and the inner ring 240 rotate independently without interference from their rotations. That is, the inner ring 240 rotates by a rotation force of the shaft 140 and the outer ring 220 rotates by a friction force with the substrate S.

The shaft 140 is inserted to penetrate the second through-hole 242 of the inner ring 240. The fixing member 270 may include a wedge 280 and a pressuring member.

Figure 8:
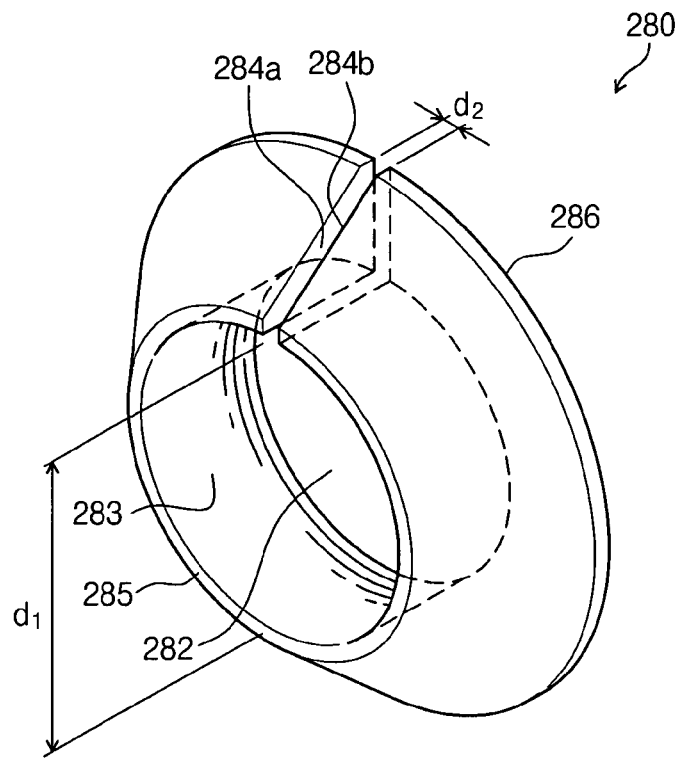
FIG. 8 is a perspective view of a wedge shown in FIG. 5.

FIG. 8 is a perspective view of the wedge 280 shown in FIG. 5. Referring to FIGS. 5 and 8, a third through-hole 282 is formed at the center of the wedge 280, and a shaft 140 (see FIG. 4) penetrates the third through-hole 282. The wedge 280 may have a substantially conic shape. The wedge 280 has a similar length to the sub-body 240b of the inner ring 240 and is inserted into the second through-hole 242b of the sub-body 240b. The third through-hole 282 is provided with the same size in the length direction of the wedge 280. The wedge 280 may be made of an elastic material. Since the wedge includes a cutting portion lengthwise, it has a first stage 284a and a second stage 284b which are opposite to each other and spaced apart from each other. Among both faces of the wedge 280, a small-area face is referred to as a front face 285 and a large-area face is referred to a rear face 286. The rear face 286 of the wedge 280 is provided to be flat roughly. The wedge 280 is inserted into the shaft 140(see FIG. 4) to let its front face 285 look toward the inner ring 240.

A distance $d_2$ between the first stage 284a and the second stage 284b increases with the pressure applied to an outside surface of the wedge 280. If the distance $d_2$ increases, a diameter $d_1$ of the third through-hole 282 also increases. If the distance $d_2$ decreases, the diameter $d_1$ also decreases. Under the state that there is no external pressure, the diameter $d_1$ of the third through-hole 282 is provided to be larger than a diameter of the shaft 140 (see FIG. 4). Under the state that a pressure is externally applied to let the first and second stages 284a and 284b be in contact with each other, the diameter $d_1$ of the through-hole of the wedge 280 is provided to be equal to or slightly small than the diameter of the shaft 140.

Figure 9:
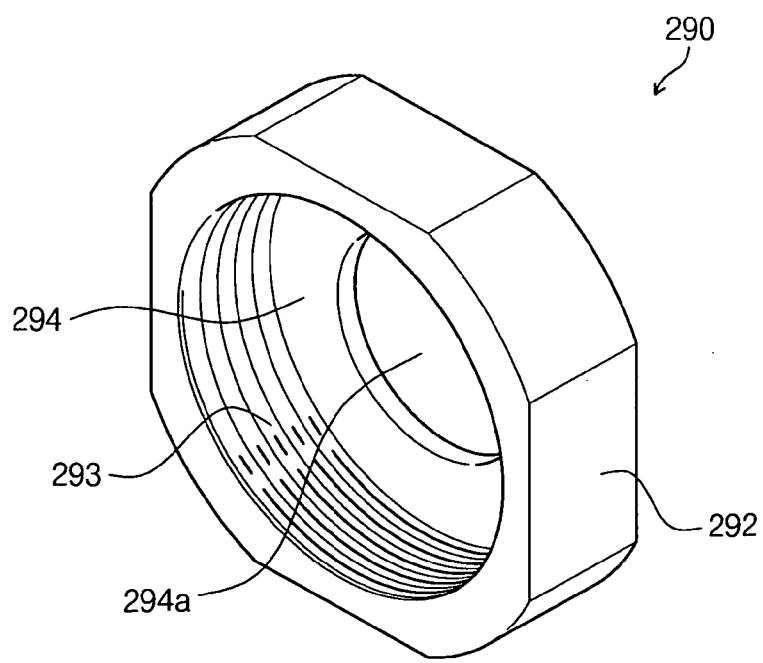
FIG. 9 is a perspective view of a cap shown in FIG. 5.

FIG. 9 is a perspective view of the pressuring member shown in FIG. 5. Referring to FIGS. 5 and 9, the pressuring member is configured to push a wedge 280 toward a main body 240a of an inner ring 240. The pressuring member may include a cap 290 where formed is a fourth through-hole 294a. The fourth trough-hole 294a is formed at the center of the cap 290. The cap 290 includes a body 292 having a space into which a sub-body 240b of the inner ring 240 is inserted and a pressuring wall 294 provided at the back end of the body 292. A screw thread 293 is formed at an inner circumferential surface of the body 292 to correspond to the screw threads 246 that is formed at the sub-body 240b of the inner ring 240. The fourth through-hole 294a is formed at the center of the pressuring wall 294, and the shaft 140 (see FIG. 4) is inserted into the fourth through-hole 294a. If the cap 290 rotates to be screw-coupled with the inner ring 240 and moves forward to the main body 240a, the pressuring wall 294 pushes the wedge 280 inserted into the second through-hole 242b of the sub-body 240b toward the main body 240a.

Figure 10:
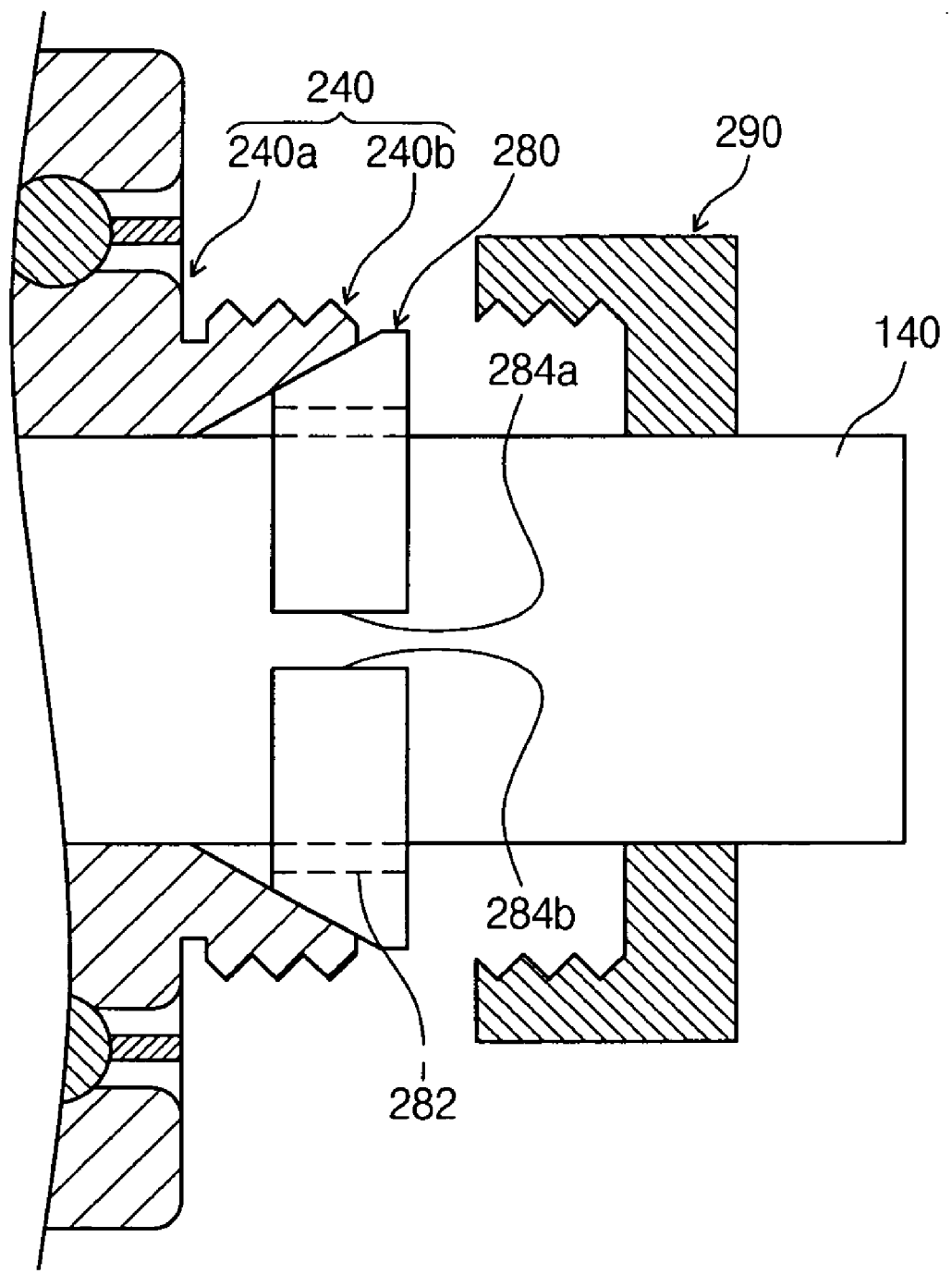
FIGS. 10 and 11 illustrate the state before the wedge is fully inserted into an auxiliary body of an inner ring and the state where the wedge is fully inserted into an auxiliary body of an inner ring, respectively.
Figure 11:
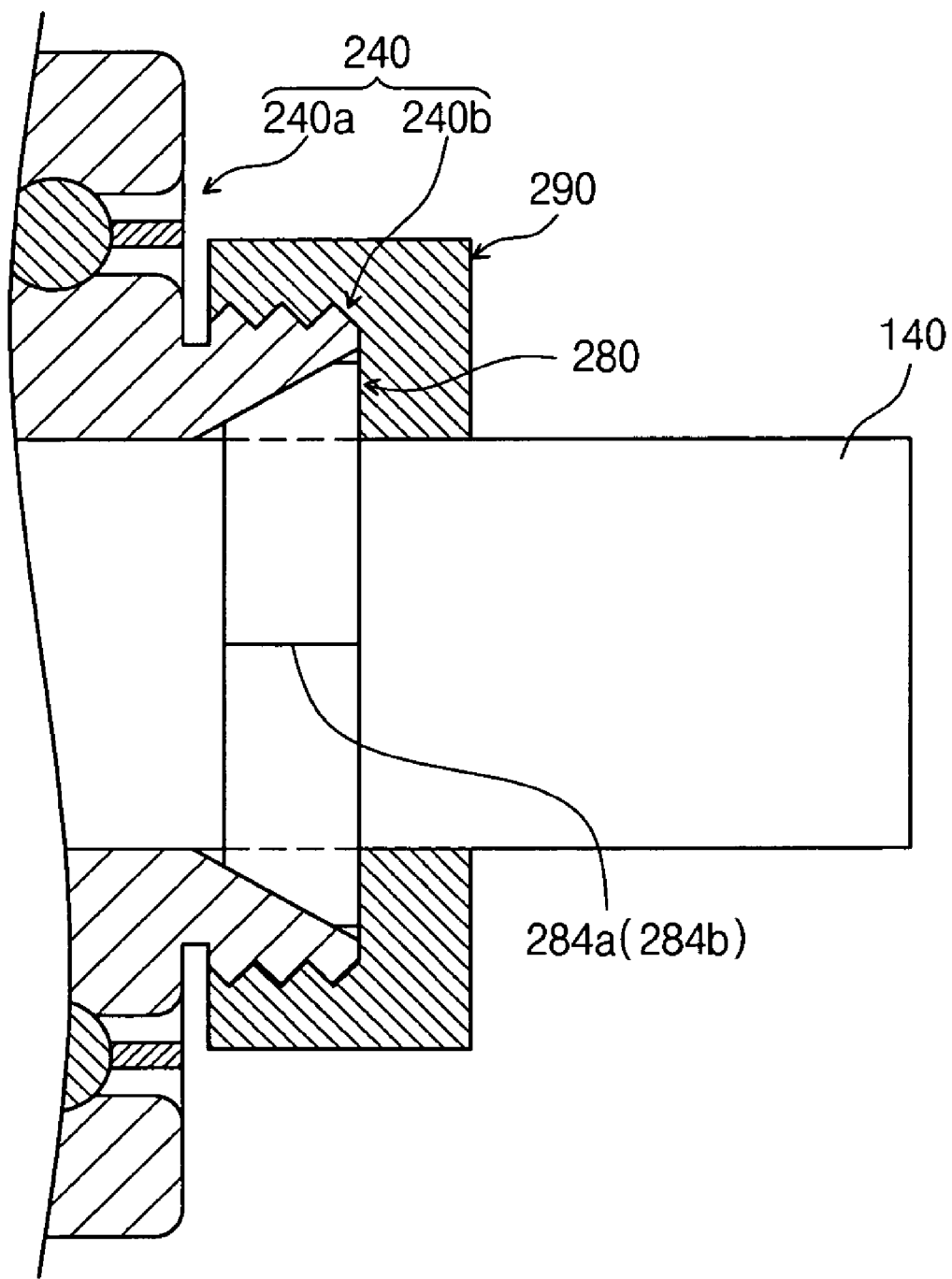

FIGS. 10 and 11 illustrate the steps that a guide unit 200 is fixed to a shaft 140 by a fixing member 270. First, as illustrated in FIG. 10, the wedge 280 is inserted into the second through-hole 242b of the sub-body 240b in a direction where the front face 285 of the wedge 280 looks toward the main body 240a of the inner ring 240. The cap 290 is screw-coupled with the inner ring 240 to let the wedge 280 move toward the main body 240a inside the sub-body 240b, as illustrated in FIG. 11, if a distance $d_2$ between the first stage 284a and the second stage 284b decreases and the wedge 280 moves a predetermined distance, the first and second stages 284a and 284b come in contact with each other. Thus, the wedge 280 is first inserted into the sub-body 240b while the inside surface 283 of the wedge 280 is spaced apart from the shaft 140. However, as the wedge 280 moves toward the main body 240a, the inside surface 283 of the wedge 280 comes in contact with the shaft 140. Thereafter, the shaft 140 is pressurized to fixedly couple the shaft 140 with the inner ring 240.

Next, a method of assembling and coupling the guide unit 200 with the shaft 140 will now be described. Referring to FIG. 6, the outer ring 220, the inner ring 250, and the bearings 260 are assembled. The bearing 260 is inserted into each through-hole 252 of the retainer ring 250. The inner ring 240 is forcibly inserted into an inner space 254 of the retainer 250 to let the retainer 250 cover the inner ring 240. An assembling body of the retainer 250 and the inner ring 240 is forcibly into the first through-hole 222 of the outer ring 220. The shaft 140 is inserted into an assembling body including the inner ring 240, the retainer 250, the bearing 260, and the outer ring 220, the wedge 280 and the cap 290 to insert the shaft 140 into the second through-hole 242 of the inner ring 240, the third through-hole 282 of the wedge 280, and the fourth through-hole 292 of the cap 290 in the order listed. The cap 290 is screw-coupled with the sub-body 240b of the inner ring 240 to fix the inner ring 240 to the shaft 140.

FIG. 12 illustrates the state where the guide unit 200 is installed in an opposite direction to shown in FIG. 6. Referring to FIG. 12, similar to the foregoing, the inner ring 240, the retainer 250, the bearing 260, and the outer ring 220 are assembled. Contrary to the foregoing, the shaft 140 is sequentially inserted into the cap 290 and the wedge 280. The shaft 140 is inserted into an assembling body including the inner ring 240, the retainer 250, the bearing 260, and the outer ring 220. The cap 290 is screw-coupled with the sub-body 240b of the inner ring 240 to fix the inner ring 240 to the shaft 140.

Next, modified embodiments according to the present invention will now be described below.

Figure 13:
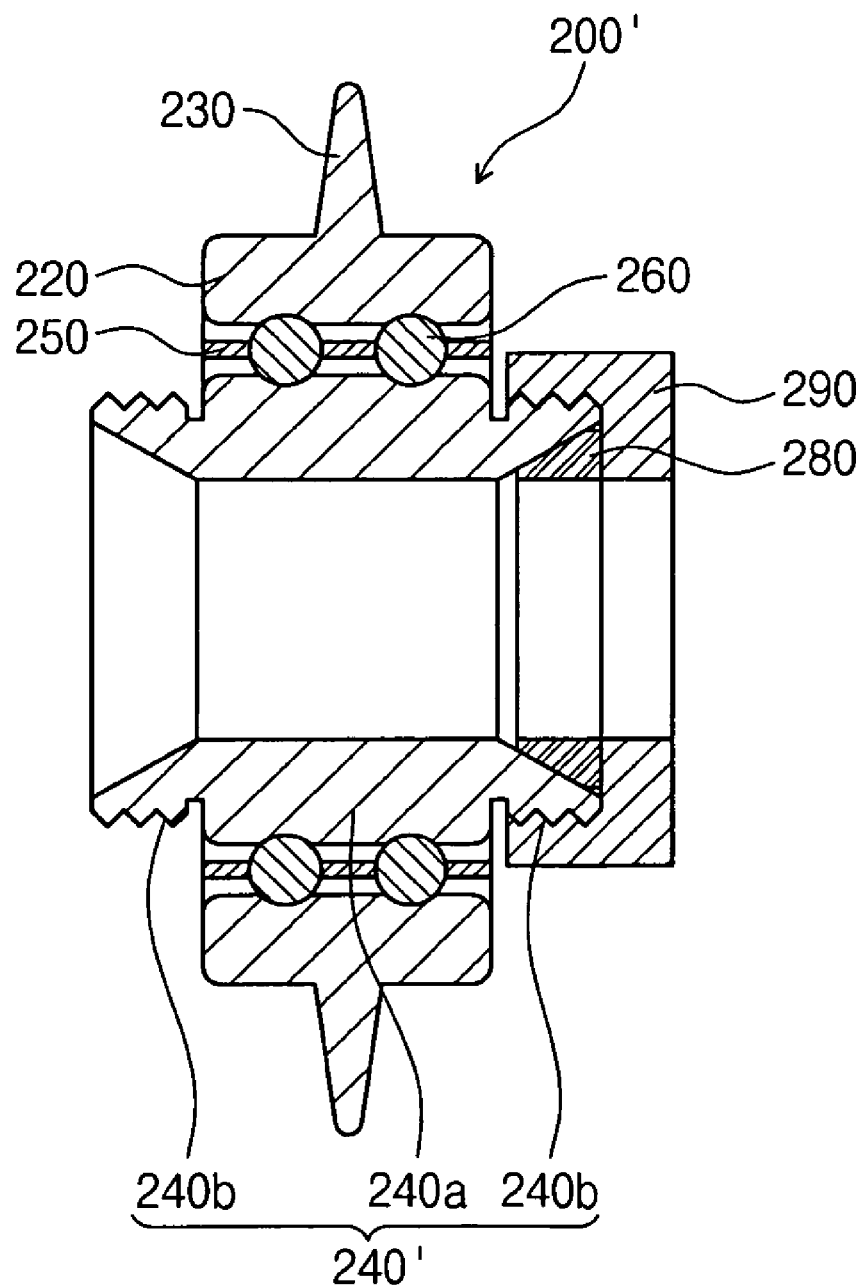
FIGS. 13 and 14 illustrate modified examples of a guide unit of the present invention, respectively.

FIG. 13 illustrates a modified guide units 200'. Referring to FIG. 13, the guide unit 200' includes an inner ring 240' having a different configuration from the foregoing embodiment. The inner ring 240' includes one main body 240a and two sub-bodies 240b provided at both sides of the main body 240a respectively. Thus, a wedge 280 and a cap 290 are more easily coupled with an inner ring 240 when the guide unit 200' is inserted into a shaft 140 with the change of install direction.

Figure 14:
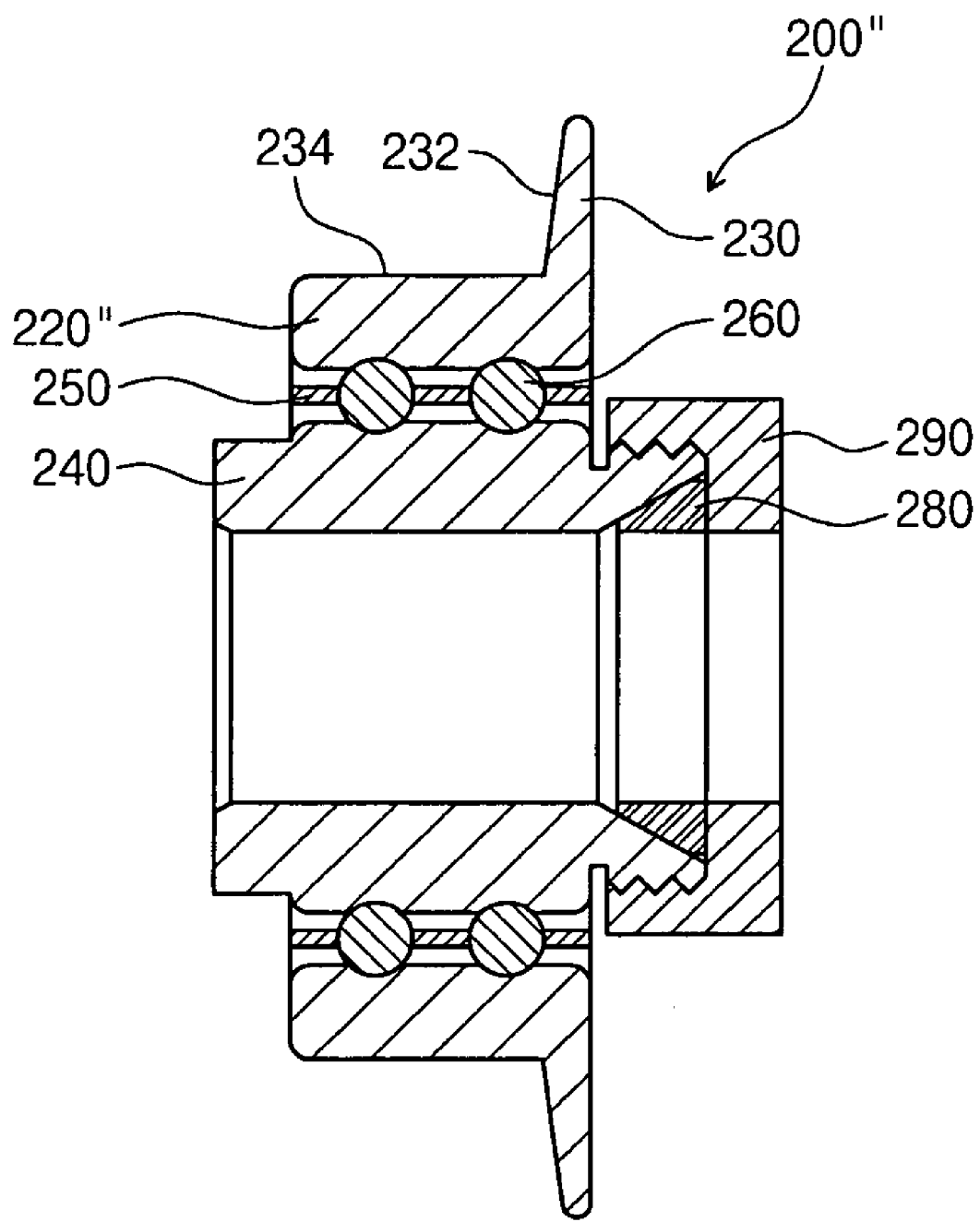

FIG. 14 illustrates another modified guide units 200". Referring to FIG. 14, the guide unit 200" includes an outer ring 220" having a different configuration from the foregoing embodiment. The outer ring 220" includes a guide 230 extending from the end of its outer circumferential surface in outside direction (radius direction). If an outer circumferential surface 224 and an inclined surface 232 of an outer ring 232 in the guide unit 200" are deteriorated, the outer ring 220" or the guide unit 200" is replaced with new one.

Figure 15:
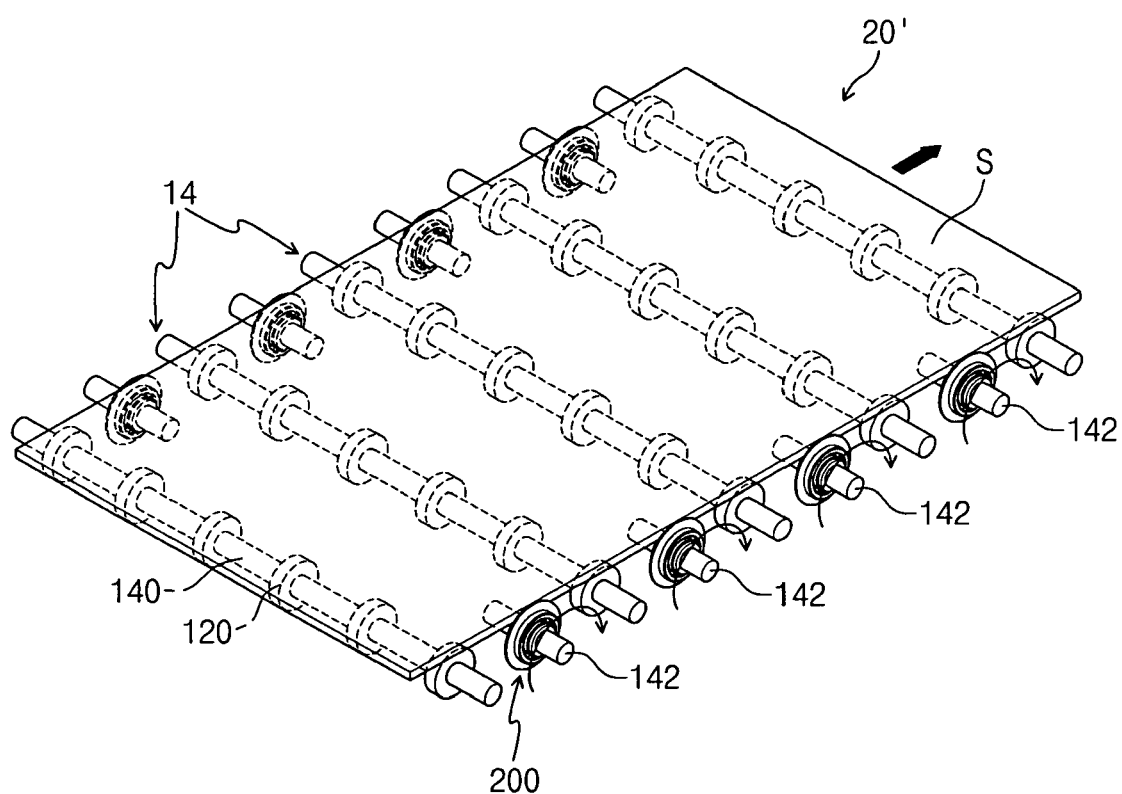
FIGS. 15 and 16 illustrate a modified example of the substrate transporting apparatus shown in FIG. 4.

FIG. 15 illustrates a modified substrate transporting apparatus 20'. While a guide unit according to the foregoing embodiment is installed on a shaft 140 where a transporting roller 120 is installed, a guide unit 200 of the substrate transporting apparatus 20' is fixedly installed at a separate shaft 142 between shafts 140 where transporting rollers 120 are installed.

Figure 2:
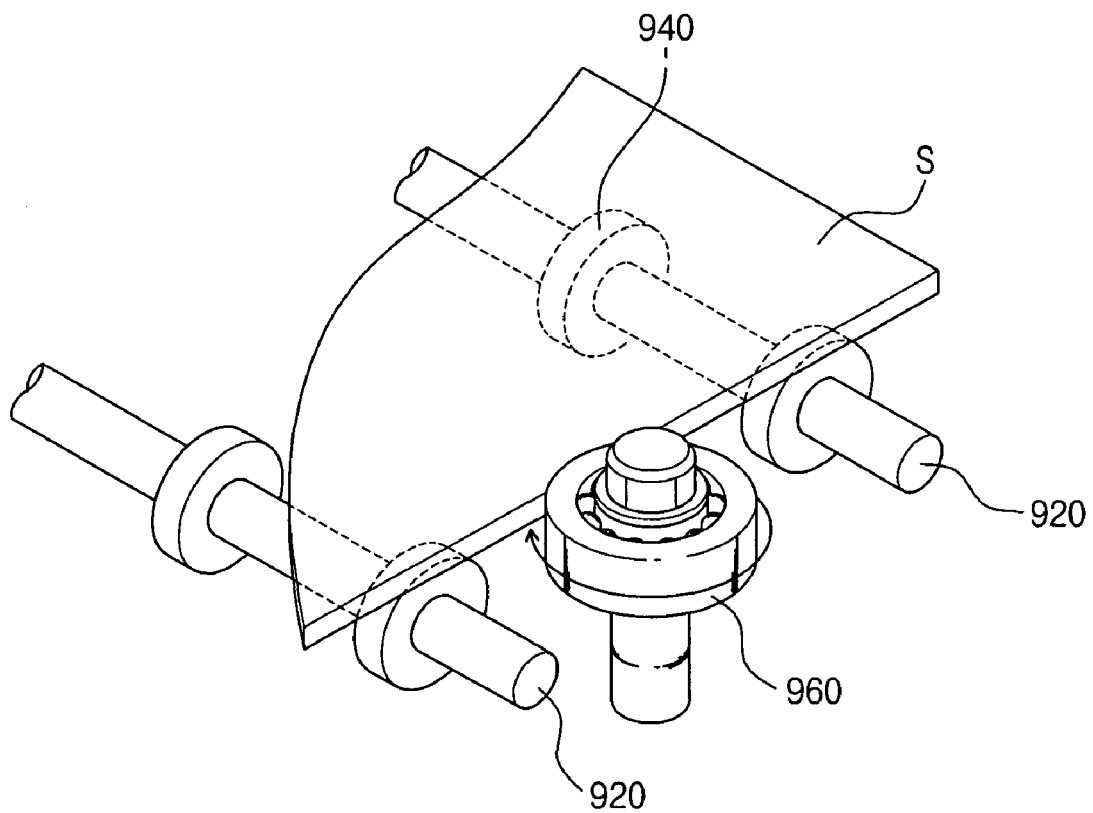
FIG. 2 is an enlarged perspective view of a substrate and side rollers shown in FIG. 1.
Figure 16:
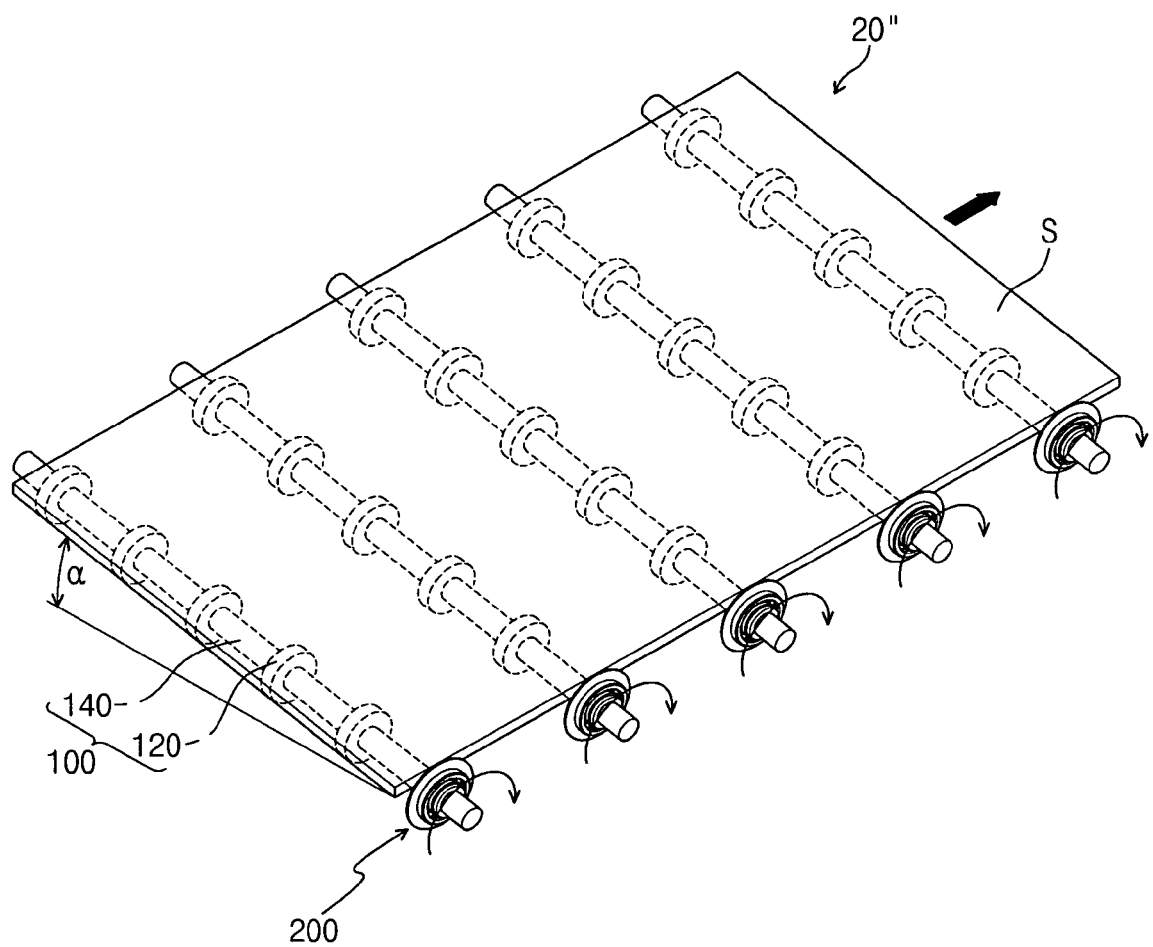

FIG. 16 illustrates a modified substrate transporting apparatus 20". The substrate transporting apparatus 20 illustrated in FIG. 2 transports a substrate S of horizontal state and includes a guide unit 200 installed at both sides of a shaft 140. However, as illustrated in FIG. 16, a shaft 140 is inclined to transport a substrate S of inclined state. In FIG. 16, the reference numeral "α" denotes an inclined angel of a shaft. The guide unit 200 is installed at a lower one of both sides of the shaft 140.

According to the present invention, the side of a substrate is protected from damage during transportation of the substrate. According to an embodiment of the present invention, the install direction of a guide unit is variable to extend the lifetime of the guide unit. According to another embodiment of the present invention, a guide unit is easily installed because it is fixedly coupled with a shaft where a transporting roller is installed.

Although the present invention has been described in connection with the embodiment of the present invention illustrated in the accompanying drawings, it is not limited thereto. It will be apparent to those skilled in the art that various substitutions, modifications and changes may be made without departing from the scope and spirit of the invention.

What is claimed is:

1. A substrate transporting apparatus comprising:
a plurality of rotatable shafts arranged in a row;
one or more transporting rollers fixedly coupled with each shaft of the plurality of shafts to rotate with the shaft, the transporting rollers comprising an outer circumferential surface having a first diameter; and
a guide unit located proximate an end of a first shaft of the plurality of shafts, the guide unit configured to guide the linear movement of a substrate transported by the transporting rollers, the guide unit comprising:
an outer ring having a first circumferential surface and a second circumferential surface each comprising a diameter that is equal to the first diameter of the outer circumferential surface of the transportation rollers, the outer ring further comprising a guide disposed between the first and second circumferential surfaces and protruding outwardly from the first and second circumferential surfaces for contacting a side of the substrate, the outer ring further comprising an axis that is perpendicular to each of the first and second circumferential surfaces such that at least a portion of the bottom surface of the substrate contacts one of the first or second circumferential surfaces and such that the guide is symmetrically disposed about the axis; and
an inner ring fixedly coupled to the first shaft to rotate with the first shaft and the transporting rollers;
wherein the guide unit is configured for installation in a first direction and a second direction, when installed in the first direction a portion of the bottom surface of the substrate contacts the first circumferential surface, and when installed in the second direction a portion of the bottom surface of the substrate contacts the second circumferential surface.

2. The substrate transporting apparatus of claim 1, wherein the guide unit further comprises:
one or more bearings disposed between the inner ring and the outer ring to allow the inner ring and the outer ring to rotate independently; and
wherein the outer ring comprises a first through-hole into which the inner ring is inserted, and the inner ring comprises a second through-hole into which the first shaft is inserted.

3. The substrate transporting apparatus of claim 2, wherein the guide unit further comprises a ring-shaped retainer which is disposed between the inner ring and the outer ring, the retainer comprising a circumference having one or more holes disposed therein, wherein the one or more bearings are inserted into the one or more holes.

4. The substrate transporting apparatus of claim 3, wherein the one or more bearings are provided to protrude outwardly and inwardly from the retainer, and
wherein grooves are formed at the inner ring and the outer ring, respectively and the bearings protruding from the retainer ring are partially inserted into the grooves.

5. The substrate transporting apparatus of claim 3, wherein the one or more bearings are arranged to form a plurality of annular columns.

6. The substrate transporting apparatus of claim 1, wherein the guide unit further comprises a fixing member configured to fix the inner ring to the first shaft.

7. The substrate transporting apparatus of claim 6, wherein the inner ring comprises:
a main body comprising a constant diameter through-hole formed in a length direction and having a same diameter as the shaft; and
a sub-body comprising a variable diameter through-hole that increases in diameter away from the main body, the sub-body extending from the main body,
wherein the fixing member comprises:
a wedge having the same shape as the variable diameter through-hole of the sub-body and including a side portion cut in its length direction to form a first stage and a second stage facing each other, and
wherein a distance between the first stage and the second stage decreases as the wedge travels toward the main body from the inside of the sub-body.

8. The substrate transporting apparatus of claim 7, wherein the wedge comprises an elastic material.

9. The substrate transporting apparatus of claim 7, wherein the wedge has a conic shape.

10. The substrate transporting apparatus of claim 7, wherein the fixing member further comprises a cap configured to push the wedge toward the main body from the inside of the sub-body.

11. The substrate transporting apparatus of claim 10, wherein a screw thread is formed at an outer circumferential surface of the sub-body,
wherein a through-hole is formed at the center of the cap and the shaft is inserted into the through-hole, and
wherein a screw thread is formed at the inner circumferential surface to correspond to the screw thread of the sub-body.

12. The substrate transporting apparatus of claim 11, wherein the sub-body is provided at both sides of the main body.

13. The substrate transporting apparatus of claim 1, wherein the guide comprises an inclined surface provided at an obtuse angle to the first circumferential surface of the outer ring.

14. The substrate transporting apparatus of claim 1, wherein the guide protrudes from a central portion of the outer ring.

15. The substrate transporting apparatus of claim 14, wherein an inclined surface is provided at both sides of the guide.

16. A substrate transporting apparatus comprising:
a plurality of rotatable shafts arranged in a row;
a plurality of transporting rollers fixedly coupled with each shaft of the plurality of rotatable shafts to rotate with the shaft; and
a guide unit located proximate an end of a first shaft of the plurality of shafts, the guide unit configured to guide the linear movement of a substrate transported by the transporting rollers, the guide unit comprising:
first and second outer circumferential surfaces for contacting a bottom edge of a substrate; and
a guide protruding outwardly from the first and second outer circumferential surfaces, the guide comprising a first inclined surface provided at an obtuse angle to the first outer circumferential surface and a second inclined surface provided at the obtuse angle to the second circumferential surface, the first and second inclined surfaces for contacting a side of the substrate, wherein the guide decreases in thickness as a distance from the first and second outer circumferential surfaces increases, wherein the first and second inclined surfaces of the guide are symmetrically disposed about an axis of the outer ring that is perpendicular to each of the first and second outer circumferential surfaces;
wherein the guide unit is configured for installation on the first shaft in a first direction and in a second direction, when installed in the first direction the first outer circumferential surface contacts the bottom edge of the substrate and the first inclined surface contacts the side of the substrate, and when installed in the second direction the second outer circumferential surface contacts the bottom edge of the substrate and the second inclined surface contacts the side of the substrate.

17. The substrate transporting apparatus of claim 16, wherein the guide unit comprises:
an outer ring comprising a first through-hole into which an inner ring is inserted;
the inner ring comprising a second through-hole into which the shaft is inserted and installed to rotate with the shaft by the rotation of the shaft; and
one or more bearings provided between the inner ring and the outer ring to allow the inner ring and the outer ring to rotate independently.

18. The substrate transporting apparatus of claim 17, wherein the inner ring comprises:
a main body comprising a constant diameter through-hole formed in a length direction to have the same diameter as the shaft; and
a sub-body comprising a variable diameter through-hole formed to have a diameter increasing away from the main body, the sub-body extending from the main body, wherein the guide unit comprises:
a wedge having the center where formed is a third through-hole into which the shaft is inserted and a side portion cut in its length direction to form a first stage and a second stage facing each other, the wedge being inserted into the variable diameter through-hole of the sub-body to fix the shaft to the inner ring, and
wherein a distance between the first stage and the second stage decreases as the wedge travels toward the main body from the inside of the sub-body.

19. The substrate transporting apparatus of claim 18, wherein the guide unit further comprises:
a cap configured to push the wedge toward the main body from the inside of the sub-body, the cap having the center where formed is a fourth through-hole into which the shaft is inserted,
wherein a screw thread is formed at the outer circumferential surface of the sub-body, and
wherein a screw thread is formed at the inner circumferential surface of the cap to correspond to the screw thread of the sub-body.

20. A guide unit provided at a substrate transporting apparatus to guide the linear movement of a substrate, the guide unit comprising:
an outer ring comprising a first through-hole centrally disposed in the outer ring and the outer ring further comprising a guide extending outwardly from an outer circumferential surface thereof, the guide comprising a first inclined surface provided at an obtuse angle to a first outer circumferential surface and a second inclined surface provided at the obtuse angle to a second circumferential surface, wherein the first and second inclined surfaces of the guide are symmetrically disposed about an axis of the outer ring that is perpendicular to each of the first and second outer circumferential surfaces;
an inner ring inserted into the first through-hole of the outer ring, the inner ring comprising a second through-hole that is centrally disposed in the inner ring; and
a plurality of bearings provided between the outer ring and the inner ring;
wherein the guide unit is configured for installation on a shaft in a first direction and in a second direction, when installed in the first direction the first outer circumferential surface contacts a bottom edge of the substrate and the first inclined surface contacts a side of the substrate, and when installed in the second direction the second outer circumferential surface contacts the bottom edge of the substrate and the second inclined surface contacts the side of the substrate.

21. The guide unit of claim 20, further comprising:
a retainer disposed between the inner ring and the outer ring,
wherein holes are formed at the outer circumferential surface of the retainer and the bearings are inserted into the holes.

22. The guide unit of claim 21, wherein the plurality of bearings are arranged at the retainer ring to form a plurality of annular columns.

23. The guide unit of claim 21, wherein a plurality of grooves is formed at the inner ring and the outer ring and the plurality of bearings is partially inserted into the plurality of grooves.

24. The guide unit of claim 21, wherein the guide protrudes from a central region of the outer ring.

25. The guide unit of claim 21, wherein the guide has a ring-shape.

26. The guide unit of claim 21, wherein the inner ring comprises a main body comprising a constant diameter through-hole formed in a length direction, the constant diameter through-hole having a same diameter as the shaft transporting the substrate; and
a sub-body comprising a variable diameter through-hole that increases in diameter away from the main body, the sub-body extending from the main body,
the guide unit comprising:
a wedge inserted into the through-hole of the sub-body and having a side cut in its length direction to form a first stage and a second stage facing each other, and
wherein a distance between the first stage and the second stage decreases as the wedge travels toward the main body from the inside of the sub-body.

27. The guide unit of claim 26, further comprising:
a cap configured to push the wedge toward the main body from the inside of the sub-body.

28. The guide unit of claim 27, wherein a screw thread is formed at an outer circumferential surface of the sub-body,
wherein the cap has the center where formed is a fourth through-hole into which the shaft is inserted, and
wherein a screw thread is formed at an inner circumferential surface of the cap to correspond to the screw thread of the sub-body.

* * * * *